(12) United States Patent
Kim

(10) Patent No.: US 8,042,068 B2
(45) Date of Patent: Oct. 18, 2011

(54) METHOD FOR PROCESSING OPTICAL PROXIMITY CORRECTION

(75) Inventor: Cheol Kyun Kim, Icheon-si (KR)

(73) Assignee: Hynix Semiconductor Inc., Icheon-si (KR)

( * ) Notice: Subject to any disclaimer, the term of this patent is extended or adjusted under 35 U.S.C. 154(b) by 449 days.

(21) Appl. No.: 12/261,257

(22) Filed: Oct. 30, 2008

(65) Prior Publication Data
US 2009/0235224 A1 Sep. 17, 2009

(30) Foreign Application Priority Data
Mar. 13, 2008 (KR) .................. 10-2008-0023550

(51) Int. Cl.
*G06F 17/50* (2006.01)
(52) U.S. Cl. ................ 716/53; 716/54; 716/55
(58) Field of Classification Search .......... 716/53, 716/54, 55
See application file for complete search history.

(56) References Cited

U.S. PATENT DOCUMENTS

| | | | | |
|---|---|---|---|---|
| 6,893,800 | B2 * | 5/2005 | Jessen et al. | 430/311 |
| 7,135,344 | B2 * | 11/2006 | Nehmadi et al. | 438/14 |
| 2003/0229880 | A1 * | 12/2003 | White et al. | 716/19 |
| 2007/0143234 | A1 * | 6/2007 | Huang et al. | 706/15 |
| 2007/0157139 | A1 * | 7/2007 | White et al. | 716/4 |
| 2008/0141211 | A1 * | 6/2008 | Bruce et al. | 716/19 |
| 2008/0178141 | A1 * | 7/2008 | Sato | 716/19 |
| 2008/0216027 | A1 * | 9/2008 | White et al. | 716/4 |
| 2008/0222587 | A1 * | 9/2008 | Smayling et al. | 716/7 |
| 2009/0278569 | A1 * | 11/2009 | Taoka et al. | 326/101 |

FOREIGN PATENT DOCUMENTS

| | | |
|---|---|---|
| JP | 2002-333701 A | 11/2002 |
| JP | 2003-151891 A | 5/2003 |
| KR | 10-2004-0026631 | 3/2004 |

OTHER PUBLICATIONS

Notice of Rejection for Korean Patent Application No. 10-2008-0023550, dated Mar. 5, 2009.

* cited by examiner

*Primary Examiner* — Jack Chiang
*Assistant Examiner* — Magid Dimyan

(57) ABSTRACT

A method for processing optical proximity correction includes preparing a chemical mechanical polishing (CMP) map; extracting calibration data depending on a focus degree with the CMP map; and correcting optical proximity with the calibration data.

4 Claims, 2 Drawing Sheets

(a)          (b)

(a)          (b)

METHOD FOR PROCESSING OPTICAL PROXIMITY CORRECTION

CROSS-REFERENCES TO RELATED APPLICATIONS

Priority is claimed to Korean patent application number 10-2008-0023550, filed on Mar. 13, 2008, which is incorporated by reference in its entirety.

BACKGROUND OF THE INVENTION

The present invention generally relates to a method for processing optical proximity correction, and more specifically, to a method for processing optical proximity correction with uniformity of the wafer surface in order to secure a process margin.

As the design rule is reduced due to increased integration of semiconductor devices, various researches for forming a fine pattern have been made.

Since the wavelength of exposure lights used in an exposing process becomes shorter, a pattern is not patterned according to a designed layout but is instead distorted.

As the pattern becomes smaller, a light strength of a specific pattern affects that of its adjacent pattern to cause an optical proximity effect where a pattern of the layout on the design has a different shape from that formed over a wafer.

The optical proximity effect needs to be compensated because it degrades performance of semiconductor devices. Optical proximity correction refers to correction of the layout to be formed over the wafer for compensation.

The optical proximity correction includes rule-based optical proximity correction for correcting the layout based on rules of mask layout correction, and model-based optical proximity correction for correcting the mask layout by predicting an image transcribed over the wafer based on mask pattern information and a wafer process condition.

For the model-based optical proximity correction, factors that cause the optical proximity effect should be considered. These factors include a process condition where a pattern of the designed layout is patterned over an actual wafer, and an exposed resulting structure.

In other words, these factors include exposure energy of an exposure light source, a focus and a topology of patterns formed over the wafer through an exposing process.

However, since the topology is measured only in consideration of the average thickness of a thin film of the wafer, variables generated from a chemical mechanical polishing (CMP) process or a deposition process cannot be verified accurately.

That is, since the topology is measured by the average thickness of patterns formed in the wafer, the topology is different in each region depending on the patterns. As a result, it is difficult to prevent collapse of the patterns in a region that is not exposed by the best focus because the focus is different.

Although the optimum condition is set for optical proximity correction, an optical proximity correction condition is different depending on the topology of the wafer, so that it is difficult to prevent damages generated in each region of the wafer.

BRIEF SUMMARY OF THE INVENTION

Various embodiments of the present invention are directed to providing a method for processing optical proximity correction in consideration of topology effects, which are different depending upon regions in a full chip of a wafer.

According to an embodiment of the present invention, a method for processing optical proximity correction may include: preparing a chemical mechanical polishing (CMP) map on the layout; extracting calibration data depending on a focus with the CMP map; and correcting optical proximity with the calibration data.

The CMP map may be divided into regions depending on CMP uniformity.

The CMP uniformity may be obtained through the relation between deposition thickness and pattern density.

The each of the regions may have different focus.

When a boundary of the region crosses a pattern, the boundary may be replaced by a new boundary so that the new boundary does not cross the pattern.

The new boundary may be set so that smaller pattern divided by the boundary may be in a same region where larger area of the pattern divided by the boundary is included.

The areas of the patterns included in the neighboring region are compared with each other based on the boundary part of the region in order to change the boundary part of the region so that the smaller area is included in the region having a larger area.

The calibration data is extracted in consideration of fluctuation of the best focus.

DESCRIPTION OF EMBODIMENTS

The present invention will be described in detail with reference to the drawings.

In a method for processing optical proximity correction according to an embodiment of the present invention, optical proximity correction is performed in each region based on optical proximity correction models represented in a CMP map of a wafer.

The CMP map is constituted by dividing regions into one region having a high pattern density and the other region having a low pattern density through information of pattern density obtained by the designed layout, confirming the topology based on the regions to obtain the best focus value suitable for the topology through simulation, and dividing the region into regions having the same best focus.

Since the topology is different depending on pattern density, regions having the best focus and defocus may be generated by an exposing process with the same focus. However, the optical proximity correction is performed with the above-described CMP map, thereby securing calibration data for optical proximity correction while reflecting the topology of the region having defocus.

Figure 1:
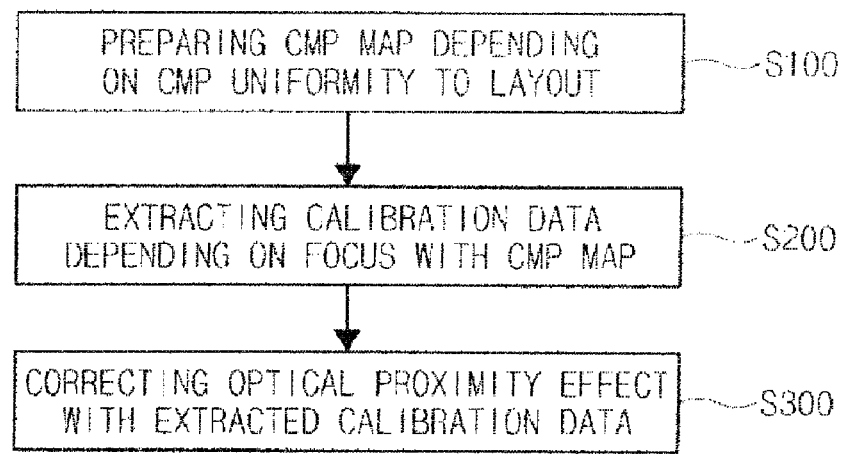
FIG. 1 is a flow chart illustrating optical proximity correction according to an embodiment of the present invention.

FIG. 1 is a flow chart illustrating optical proximity correction according to an embodiment of the present invention. Referring to FIG. 1, a CMP map is prepared to include regions (referred to as 'clip') divided depending on CMP uniformity of the original layout. The CMP uniformity can be obtained through the relation with the deposition thickness depending on pattern density.

Figure 2:
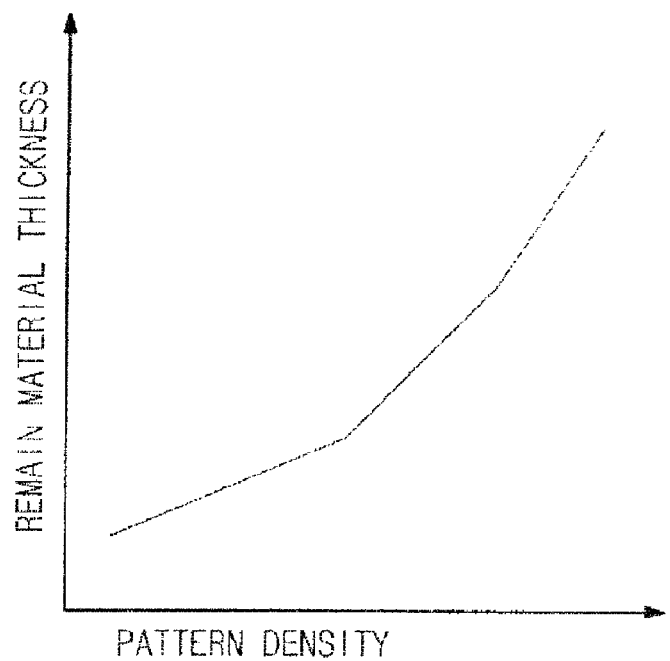
FIG. 2 is a graph illustrating a deposition thickness depending on pattern density.

FIG. 2 is a graph illustrating a deposition thickness depending on pattern density. As shown in FIG. 2, a step difference is generated between a region having a high pattern density and a region having a low pattern density because the deposition thickness becomes thicker as the pattern density becomes higher. As a result, the whole region is divided into regions each having the same thickness, which are represented by a clip.

Figure 3:
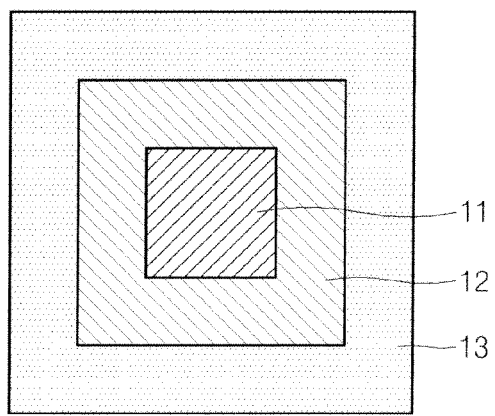
FIG. 3(a) is a diagram illustrating a CMP map according to an embodiment of the present invention.
FIG. 3(b) is a graph illustrating focus fluctuation depending on the CMP map.
Figure 3:
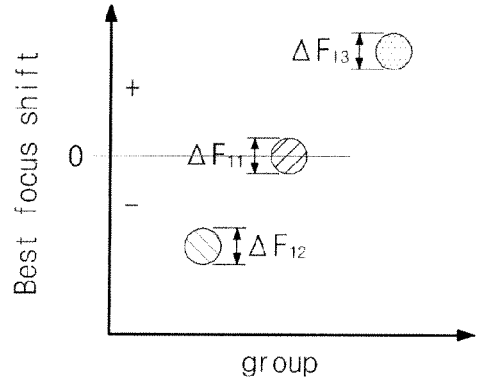

FIG. 3(a) is a diagram illustrating a CMP map according to an embodiment of the present invention, and FIG. 3(b) is a graph illustrating focus fluctuation depending on the CMP map. Referring to FIG. 3(a), the CMP map includes three clips 11, 12, 13. The CMP map can be constituted to have a different structure depending on regions each having a different focus.

Figure 4:
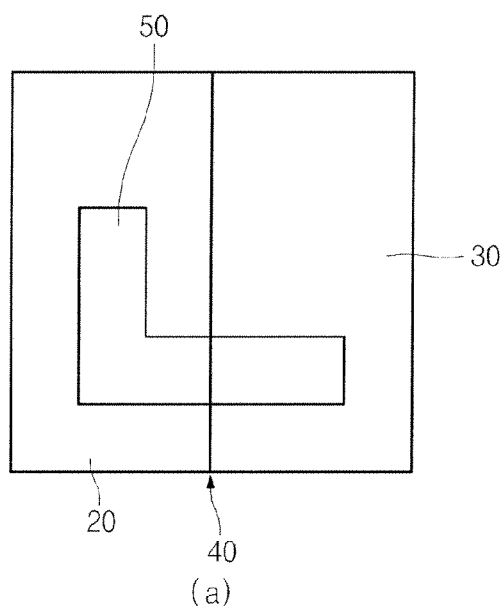
FIGS. 4(a) and 4(b) are diagrams illustrating the boundary part of the CMP map according to an embodiment of the present invention.
Figure 4:
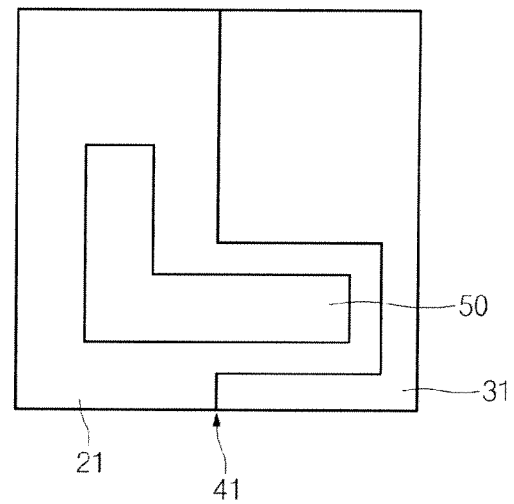

FIG. 4 is a diagram illustrating the boundary part of the CMP map according to an embodiment of the present invention. As shown in FIG. 4(a), a boundary part 40 of the clip is moved when clips 20 and 30 each having a different focus include a pattern 50, respectively, based on the boundary part 40 of the clip. As shown in FIG. 4(b), clips 21 and 31 are formed so that the boundary part of the clip has no pattern 50, thereby obtaining the CMP map.

That is, the clip is extended or reduced so that the pattern 50 may be included in one of the clips 20 and 30 which are neighboring with each other based on the boundary part 40 of the clip, thereby obtaining the clips 21 and 31. Specifically, by comparing the area of the pattern positioned in the neighboring clips 20 and 30 based on the boundary part 40 of the clip, the boundary part of the clip is preferably moved so that the clip including the pattern having a large area may be extended.

Since the boundary part 40 of the clip is not changed remarkably when the pattern 50 is included in the boundary part 40 of the clip as shown in FIG. 4(a), the boundary part 41 of the clip is altered as shown in FIG. 4(b), so that the pattern 50 is positioned in the region 21 having the same focus. Then, calibration data depending on the focus degree are extracted using the CMP map (S200).

That is, as shown in FIG. 3(b), the best focus corresponding to each clip is selected using the CMP map of FIG. 3(a) that shows a step difference generated depending on the pattern density, and calibration data for modeling are extracted in a condition having the corresponding focus. When an exposing process is performed with the best focus extracted depending on each clip, a critical dimension of the pattern formed over the wafer is measured to secure the calibration data.

The best focus corresponding to each clip 11, 12, 13 has a different value, thereby obtaining the different calibration data in each region. As a result, the calibration data are secured not in all regions under the same condition, but in each region having a step difference based on information of the CMP map.

Also, it is preferable to secure the calibration data by reflecting spec of a specific focus, that is, values ($\Delta F11$, $\Delta F12$, $\Delta F13$) in consideration of fluctuation of the corresponding focus, as well as the best focus. Then, the optical proximity effect is corrected with the calibration data extracted depending on the focus degree (S300).

The calibration data are secured in each clip 10 having a different focus obtained by the CMP map, thereby correcting the optical proximity effect. Although there is a region having defocus, the same pattern formed over the actual wafer can be formed in the original layout designed like the best focus region.

That is, even when the same exposure condition is applied to the defocus region and the best focus region, the calibration data of the defocus region are reflected, so that the pattern may not be distorted.

As described above, a method for processing optical proximity correction according to an embodiment of the present invention comprises preparing a CMP map depending on pattern density, performing a modeling process with the CMP map, and processing optical proximity correction, thereby improving accuracy of the optical proximity correction and stabilizing the process.

The above embodiments of the present invention are illustrative and not limitative. Various alternatives and equivalents are possible. The invention is not limited by the type of deposition, etching polishing, and patterning steps describe herein. Nor is the invention limited to any specific type of semiconductor device. For example, the present invention may be implemented in a dynamic random access memory (DRAM) device or non volatile memory device. Other additions, subtractions, or modifications are obvious in view of the present disclosure and are intended to fall within the scope of the appended claims.

What is claimed is:

1. A method, implemented in a memory device, for processing optical proximity correction to correct a layout of a pattern to be formed over a semiconductor wafer for compensation, the method comprising:
   preparing a chemical mechanical polishing (CMP) map in the memory device;
   extracting calibration data depending on a focus with the CMP map;
   correcting optical proximity with the calibration data; and
   utilizing the calibration data to correct the layout to be formed over the semiconductor wafer for compensation;
   wherein the CMP map is divided into regions depending on CMP uniformity, the regions defined by boundaries;
   wherein when a boundary of one of the regions crosses the pattern, the boundary of the region is replaced by a new boundary so that the new boundary does not cross the pattern; and
   wherein the new boundary is set so that a smaller area of the pattern divided by the boundary may be in a same region where a larger area of the pattern divided by the boundary is included.

2. The method according to claim 1, wherein the CMP uniformity is obtained through the relation between deposition thickness and pattern density.

3. The method according to claim 1, wherein each of the regions has different focus.

4. The method according to claim 1, wherein the calibration data is extracted in consideration of fluctuation of the focus.

* * * * *